(12) United States Patent
Stilgenbauer

(10) Patent No.: US 12,248,728 B2
(45) Date of Patent: Mar. 11, 2025

(54) CENTRALIZED DIGITAL MUTE AND VOLUME CONTROL

(71) Applicant: STMicroelectronics S.r.l., Agrate Brianza (IT)

(72) Inventor: Francesco Stilgenbauer, Rho (IT)

(73) Assignee: STMicroelectronics S.r.l., Agrate Brianza (IT)

(*) Notice: Subject to any disclaimer, the term of this patent is extended or adjusted under 35 U.S.C. 154(b) by 412 days.

(21) Appl. No.: 17/846,586

(22) Filed: Jun. 22, 2022

(65) Prior Publication Data
US 2023/0418548 A1 Dec. 28, 2023

(51) Int. Cl.
G06F 3/16 (2006.01)
H03G 3/00 (2006.01)
H03G 3/30 (2006.01)

(52) U.S. Cl.
CPC .......... *G06F 3/165* (2013.01); *H03G 3/002* (2013.01); *H03G 3/3005* (2013.01); *H03G 3/3089* (2013.01)

(58) Field of Classification Search
CPC .... G06F 3/165; H03G 3/3005; H03G 3/3089; H03G 3/002
See application file for complete search history.

(56) References Cited

U.S. PATENT DOCUMENTS

| | | | |
|---|---|---|---|
| 6,462,621 | B1 | 10/2002 | Charles et al. |
| 6,803,869 | B1 | 10/2004 | Melanson et al. |
| 8,639,370 | B2 | 1/2014 | Torrini et al. |
| 8,890,608 | B2 | 11/2014 | Sahandiesfanjani et al. |
| 2008/0025520 | A1 | 1/2008 | Sakai et al. |
| 2013/0101138 | A1 | 4/2013 | Kubo et al. |
| 2018/0351523 | A1* | 12/2018 | Lesso ............ H03G 3/3089 |
| 2021/0091739 | A1* | 3/2021 | Matamura ........ H03G 3/3005 |

FOREIGN PATENT DOCUMENTS

JP 4661422 B2 1/2011

OTHER PUBLICATIONS

EPO Search Report and Written Opinion for counterpart EP Appl. No. 23175278.3, report dated Nov. 15, 2023, 8 pgs.
Analog Devices: "Digital 2.5 W, 5.1 V, Boost Class-D Audio Amplifier with Output Sensing," SSM4567 Data Sheet, 2014, 52 pgs.
Texas Instruments: White Paper "Cross Fade of Digital Audio Streams," SPRAAJ5, Jul. 2008, 12 pgs.

* cited by examiner

*Primary Examiner* — Basil T. Jos
*Assistant Examiner* — Jay Khandpur
(74) *Attorney, Agent, or Firm* — Crowe & Dunlevy LLC

(57) ABSTRACT

An audio device includes a gain step selection circuit that receives a different requested gain value and an associated requested step size from each of a plurality of sources, compares each requested gain value to a same feedback gain value and generates a polarity based thereupon, performs step polarization on each requested step size as a function of the generated polarity therefor to thereby generate a plurality of step values, and outputs a least of the plurality of step values as an output step value. An accumulator circuit generates a current input gain value based upon the output step value and the feedback gain value, and then updates the feedback gain value to be equal to the current input gain value. A normalizing circuit multiplies an input data value by the current input gain value and applies a truncation function to a result thereof to produce an output data value.

22 Claims, 6 Drawing Sheets

CENTRALIZED DIGITAL MUTE AND VOLUME CONTROL

TECHNICAL FIELD

This disclosure is related to a centralized digital fader circuit that generates and applies a fade-in or fade-out gain ramp (linear or non-linear) to an input digital signal, for example to achieve digital muting and volume control in an audio playback device.

BACKGROUND

In a digital audio playback chain, an input digital signal is processed (e.g., by interpolation and noise shaping) and then converted to an output analog signal which is amplified and used to drive an audio playback device such as a speaker.

During audio playback, it may be desired to perform volume control such as muting, which lowers current playback volume to a minimum volume. Muting (or volume control to lower volume) is performed by applying a downward sloping linear or non-linear gain ramp to the audio signal, and volume control to increase volume is performed by applying an upward sloping linear or non-linear gain ramp to the audio signal.

Conventionally, muting may be performed in an analog fashion, such as in the digital to analog conversion or in the amplification of the output audio signal. Analog muting is useful when it is desired for the gain ramp to be fast (e.g., 10 μs), for example for device protection or to provide for fast turn-on or fast turn-off. A combination of analog and digital muting may also be performed, with the digital muting being performed on the input digital signal prior to analog conversion. Digital muting is useful when it is desired for the gain ramp to be slow (e.g., 700 ms), such as in mastering and mixing operations.

Muting (or removal of muting) and volume control may be controlled by different sources, with different gain ramps, for different reasons, during operation. If the sources each involve a low time to mute/un-mute (e.g., ≤10 ms), then analog muting alone is sufficient. If at least one source involves a higher time to mute/unmute (e.g., 700 ms), then digital muting or a combination of analog and digital muting is to be utilized.

Conventionally, muting and volume control is not under centralized control in a digital audio playback chain. Also, the time to mute/un-mute in a digital audio playback chain has limitations in what it can be set to.

Conventional analog approaches to muting and volume control have limitations in that analog muting utilizes components such as capacitors, and the lengths of the gain ramps that can be generated are dependent upon those components and the limitations inherent to those components (e.g., the area of a capacitor increases with the gain ramp length it is to apply, yet the charging current for that capacitor has a lower threshold below which noise issues arise).

As such, due to these drawbacks present with both conventional analog and digital approaches to muting, further development is needed.

SUMMARY

Disclosed herein is a device including a gain step selection circuit. The gain step selection circuit is configured to receive a different requested gain value and an associated requested step size from each of a plurality of sources, compare each requested gain value to a same feedback gain value and generate a polarity based thereupon, perform step polarization on each requested step size based upon the polarity generated from its associated requested gain value to thereby generate a plurality of step values, and output a least one of the plurality of step values as an output step value. An accumulator circuit is configured to generate a current input gain value based upon the output step value and the feedback gain value, and then update the feedback gain value to be equal to the current input gain value. A normalizing circuit is configured to multiply an input data value by the current input gain value and apply a truncation function to a result thereof to produce an output data value.

The gain step selection circuit may perform the step polarization on each requested step size by maintaining the requested step size at its current value if the requested step size is greater than the feedback gain value, setting the requested step size to zero if the requested step size is equal to the feedback gain value, and inverting a sign of the requested step size if the requested step size is less than the feedback gain value.

The accumulator circuit may be configured to generate the current input gain value by adding the output step value to the feedback gain value, and to update the feedback gain value by adding the current input gain value to the feedback gain value.

The accumulator circuit may be further configured to apply a saturation function to the sum of the output step value and the feedback gain value to thereby generate the current input gain value.

The accumulator circuit may include a summing circuit receiving as input the output step value and adding the output step value to the feedback gain value to produce the current input gain value, and a register receiving as input the current input gain value to thereby update the feedback gain value. The accumulator circuit may also include a multiplier applying a multiplication factor to the feedback gain value prior to the feedback gain value being received by the summing circuit, the multiplication factor being a non-zero floating point number less than one or a fixed point number, depending on implementation.

The accumulator circuit may include a summing circuit receiving as input the output step value and adding the output step value to the feedback gain value, and a register receiving output of the summing circuit to thereby update the feedback gain value and output the current input gain value. The accumulator circuit may also include a multiplier applying a multiplication factor to the feedback gain value prior to the feedback gain value being received by the summing circuit, the multiplication factor being a non-zero floating point number less than one.

The accumulator circuit may include a first summing circuit receiving as input the output step value and adding a first register output to the output step value to produce a first intermediate output, a first register receiving as input the first intermediate output to thereby update the stored gain value, a second summing circuit receiving as input either the first intermediate output or the stored gain value and adding the feedback gain value thereto in order produce a second intermediate output, and a second register receiving as input the second intermediate output to thereby update the feedback gain value, with the current input gain value being equal to either the second intermediate output or the feedback gain value.

The gain step selection circuit may include a first three-value comparator receiving a first of the different requested gain values and the feedback gain value as input, the first three-value comparator configured to compare the received requested gain value to the feedback gain value and output a negative polarity if the requested gain value is less than the feedback gain value, output a positive polarity if the requested gain value is greater than the feedback gain value, and output a null polarity if the requested gain is equal to the feedback gain value. The gain step selection circuit may also include a first step polarization circuit configured to perform step polarization on the first of the different requested gain values to produce one of the plurality of step values, based upon the polarity output by the first three-value comparator. The gain step selection circuit may also include a second three-value comparator receiving a second of the different requested gain values and the feedback gain value as input, the second three-value comparator configured to compare the received requested gain value to the feedback gain value and output a negative polarity if the requested gain value is less than the feedback gain value, output a positive polarity if the requested gain value is greater than the feedback gain value, and output a null polarity if the requested gain is equal to the feedback gain value. The gain step selection circuit may further include a second step polarization circuit configured to perform step polarization on the second of the different requested gain values to produce another of the plurality of step values based upon the polarity output by the second three-value comparator, and a minimum selector circuit configured to receive each of the plurality of step values as input and output a least of the plurality of step values as the output step value.

A first three-value comparator may receive a first of the different requested gain values and the feedback gain value as input, the first three-value comparator configured to compare the received requested gain value to the feedback gain value and output a negative polarity if the requested gain value is less than the feedback gain value, output a positive polarity if the requested gain value is greater than the feedback gain value, and output a null polarity if the requested gain is equal to the feedback gain value. A first step polarization circuit may be configured to perform step polarization on the received value to produce one of the plurality of step values, based upon the polarity output by the first three-value comparator. An anti-oscillation circuit is configured to calculate an absolute value of a difference between the first of the different requested gain values and the feedback gain value, pass the requested step size associated with the first of the different requested gain values to the first step polarization circuit for use as the received value if the requested step size is greater than the absolute value, and otherwise pass the absolute value to the first step polarization circuit for use as the received value.

A second three-value comparator may receive a second of the different requested gain values and the feedback gain value as input, the second three-value comparator configured to compare the received requested gain value to the feedback gain value and output a negative polarity if the requested gain value is less than the feedback gain value, output a positive polarity if the requested gain value is greater than the feedback gain value, and output a null polarity if the requested gain is equal to the feedback gain value. A second step polarization circuit may be configured to perform step polarization on the requested step size to produce another of the plurality of step values, based upon the polarity output by the second three-value comparator. A minimum selector circuit may be configured to receive each of the plurality of step values as input and output a least of the plurality of step values as the output step value.

The anti-oscillation circuit may include a subtraction circuit configured to determine a difference between the first of the different requested gain values and the feedback gain value, an absolute value circuit configured to determine an absolute value of the difference determined by the subtraction circuit, a comparison circuit configured to compare the requested step size associated with the first of the different requested gain values to the absolute value, and a multiplexing circuit configured to receive output from the comparison circuit and to pass the requested step size associated with the first of the different requested gain values to the first step polarization circuit for use as the received value if the requested step size is greater than the absolute value, and otherwise pass the absolute value to the first step polarization circuit for use as the received value.

An interpolator may receive an input digital audio signal and perform interpolation thereon to produce the input data value. A preconverter may receive the output data value and perform digital processing thereon to produce an output digital audio signal. A digital to analog converter may be configured to convert the output digital audio signal to an output analog audio signal. An audio transducer may be driven by the output analog audio signal.

As an alternative, an interpolator may receive the output data value and perform interpolation thereon, a preconverter may receive the output data value after interpolation and perform digital processing thereon to produce an output digital audio signal, a digital to analog converter may be configured to convert the output digital audio signal to an output analog audio signal, and an audio transducer may be driven by the output analog audio signal.

Also disclosed herein is a method aspect. The method is a method of digital audio signal processing including receiving a different requested gain value and an associated requested step size from each of a plurality of sources, comparing each requested gain value to a same feedback gain value and generating a polarity based thereupon, performing step polarization on each requested step size based upon the polarity generated from its associated requested gain value to thereby generate a plurality of step values, outputting a least of the plurality of step values as an output step value, and generating a current input gain value based upon the output step value and the feedback gain value. The feedback gain value is updated to be equal to the current input gain value, an input data value is multiplied by the current input gain value, and a truncation function is applied to a result thereof to produce an output data value.

The gain step selection circuit may perform the step polarization on each requested step size by maintaining the requested step size at its current value if the requested step size is greater than the feedback gain value, setting the requested step size to zero if the requested step size is equal to the feedback gain value, and inverting a sign of the requested step size if the requested step size is less than the feedback gain value.

The current input gain value may be generated by adding the output step value to the feedback gain value, and the feedback gain value may be updated by adding the current input gain value to the feedback gain value.

The method may include applying a saturation function to the sum of the output step value and the feedback gain value to thereby generate the current input gain value.

The method may further include calculating an absolute value of a difference between one of the requested gain values and the feedback gain value. The step polarization for one of the requested step sizes associated with the one of the requested gain values may be performed on the absolute value if that requested step size is not greater than the absolute value.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
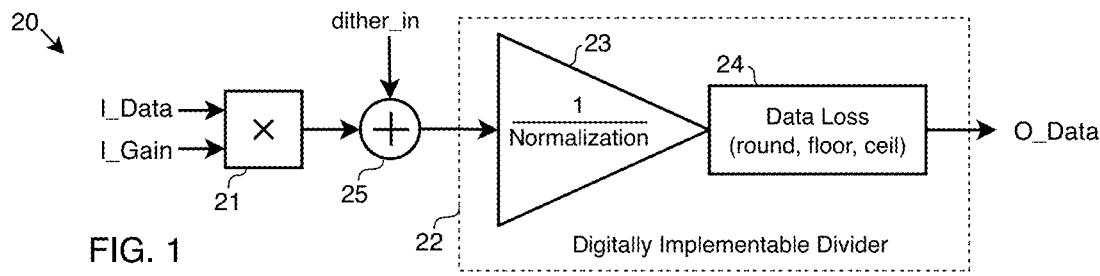
FIG. 1 is a block diagram of a normalization circuit such as may be used in the muting circuits of the digital signal chains described herein.

A digital signal chain, such as an audio playback circuit, will be described hereinbelow, but first, the concept of a normalizing circuit 20 will be described with reference to FIG. 1. The normalizing circuit 20 includes a multiplication circuit 21 that receives an input data signal I_Data and an input gain value I_Gain, and multiplies the input data signal I_Data by the input gain value I_Gain. The input gain value I_Gain ranges from 0 to a maximum value MaxGain, with MaxGain being a fixed value for a given implementation. MaxGain is a fixed point value or a floating point value greater than or equal to one. The result of the multiplication performed by the multiplication circuit 21 is a multiplication of I_Data by I_Gain. If the input gain value I_Gain is equal to MaxGain, then the result of the multiplication is I_Data multiplied by MaxGain. A summer 25 injects a dither signal dither in into the output of the multiplication circuit 21 before passage to a digitally implementable divider 22. The digitally implementable divider 22 includes a dividing circuit 23 that divides the output of the summer 25 by a normalization value (labelled here as Normalization), and a data loss circuit 24 that performs a truncation function such as a rounding, floor, or ceiling function on the output of the dividing circuit 23 to produce the normalized output data signal O_Data. The normalization value Normalization is a fixed value for a given implementation, and is a fixed or floating point value that is greater than one.

The ratio of MaxGain to Normalization $$\frac{\text{MaxGain}}{\text{Normalization}}$$

defines, when I_Gain=MaxGain, whether amplification, maintaining, or attenuating is being performed to the input data signal I_Data. For example, when the ratio is greater than one, amplification is being performed (O_Data>I_Data); when the ratio is one, maintenance is performed (O_Data=I_Data); and when the ratio is less than one, attenuation is being performed (O_Data<I_Data).

For the case where the ratio $$\frac{\text{MaxGain}}{\text{Normalization}}$$

is greater than one, but I_Gain is less than MaxGain, it is possible to amplify, maintain, or attenuate I_Data with the dividing circuit 23. I_Gain ranges freely between [0, MaxGain]. If Normalization<I_Gain<MaxGain, then O_Data will be an amplified version of I_Data. If I_Gain=Normalization, then O_Data will be equal to I_Data. If 0≤I_Gain<Normalization, then O_Data will be an attenuated version of I_Data.

For the case where the ratio $$\frac{\text{MaxGain}}{\text{Normalization}}$$

is equal to one, but I_Gain is less than or equal to MaxGain, it is possible to maintain or attenuate I_Data with the dividing circuit 23. I_Gain ranges freely between [0, MaxGain]. If I_Gain=MaxGain=Normalization, then O_Data will be equal to I_Data. If 0≤I_Gain<Normalization, then O_Data will be an attenuated version of I_Data.

For the case where the ratio $$\frac{\text{MaxGain}}{\text{Normalization}}$$

is less than one, but I_Gain is less than MaxGain, it is possible to attenuate I_Data with the dividing circuit 23. I_Gain ranges freely between [0, MaxGain]. If 0≤I_Gain≤MaxGain<Normalization, then O_Data will be an attenuated version of I_Data.

In a particular case, MaxGain may be a fixed point power of two. Therefore, the maximum gain value MaxGain can be calculated as $2^P$, with P being a positive integer. The maximum gain value MaxGain is therefore a positive integer. When I_Gain=MaxGain=$2^P$, the result of the multiplication performed by the multiplication circuit 21 is therefore a multiplication of I_Data by $2^P$ if the input gain value I_Gain is equal to MaxGain. The dividing circuit 23 then divides the output of the multiplication circuit 21 by a value of Normalization=$2^Q$ to produce the normalized output data signal O_Data.

Suppose that P is greater than Q. The ratio $$\frac{\text{MaxGain}}{\text{Normalization}}$$

would therefore be greater than one, meaning that the dividing circuit 23 can therefore amplify, maintain, or attenuate I_Data. I_Gain ranges freely between [0, MaxGain]. If Normalization<I_Gain≤MaxGain, then O_Data will be an amplified version of I_Data. If I_Gain=Normalization, then O_Data will be equal to I_Data. If 0≤I_Gain<Normalization, then O_Data will be an attenuated version of I_Data.

Figure 2:
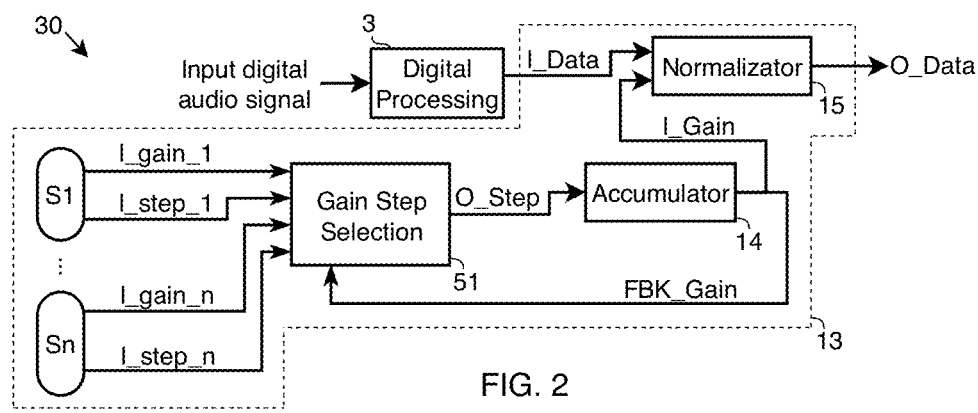
FIG. 2 is a block diagram of a digital signal chain including a fader circuit described herein.

Referring now to FIG. 2, a digital signal chain 30 is now described. A digital processing circuit 3 receives an input digital signal (which may be, for example, a digital audio signal) and processes (for example by performing interpolation on a digital audio signal) the input digital signal to produce an input data signal I_Data which is received by a muting circuit 13. The muting circuit 13 applies a new rising or falling gain ramp (linear or non-linear) to the input data signal I_Data to produce an output data signal O_Data. This functionality of the muting circuit 13 may be performed digitally within a microprocessor, a digital signal processor, a field programmable gate array, or any other suitable programmable digital device. This functionality of the muting circuit 13 may also be performed by discrete components alone or in combination with any suitable programmable digital device. The muting circuit 13 is clock driven, and may be operated based on a single clock signal or based upon multiple different clock signals, depending upon specific implementation.

The muting circuit 13 includes a gain step selection circuit 51 that receives requested gain values I_gain_1, . . . , I_gain_n and associated step values I_step_1, . . . , I_step_n from sources S1, . . . , Sn. Each gain value I_gain_1, . . . , I_gain_n has a value within a range of [0, MaxGain], and each step value_step_1, . . . , I_step_n has a value within a range of [0, MaxGain].

The gain step selection circuit 51, which will be explained in greater detail below, operates to compare each received gain value I_gain_1, . . . , I_gain_n to a feedback gain value FBK_Gain being applied to the input data signal I_Data, to produce the output data signal O_Data and determine a polarity based upon each such comparison, and then multiply each determined polarity by its respective associated step value I_step_1, . . . , I_step_n, with the lowest of the resulting values being passed by minimum circuit 57 as an output step value O_Step from the gain step selection circuit 51.

The muting circuit 13 includes an accumulator circuit 14 that generates the input gain value I_Gain for a normalizing circuit 15 from the output step value O_Step received from the gain step selection circuit 51. The accumulator circuit 14 also generates the feedback gain value FBK_Gain, which is representative of the current value of the input gain I_Gain. The normalizing circuit 15 receives, as input, the input data signal I_Data from the digital processing circuit 3 and the input gain signal I_Gain from the accumulator circuit 14. The normalizing circuit 15 normalizes the input data signal I_Data to the output gain signal I_Gain to produce the normalized output data signal O_Data. This normalization operation proceeds as described above with reference to FIG. 1.

Figure 3:
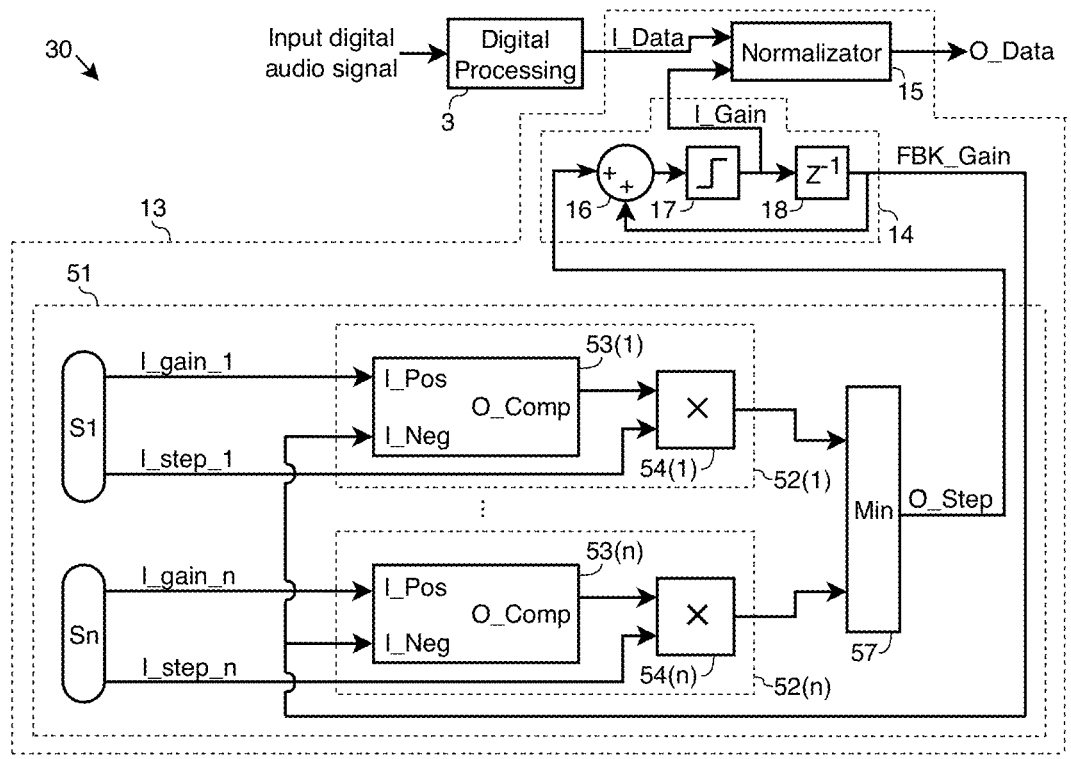
FIG. 3 is a block diagram of the digital signal chain of FIG. 2 with details of one embodiment of the accumulator circuit and one embodiment of the gain step selection circuit shown.

Potential implementation details of the accumulator circuit 14 and gain step selection circuit 51 are now described with additional reference to FIG. 3.

The accumulator circuit 14 includes a summer 16 that adds the step signal O_Step from the gain step selection circuit 51 to the feedback gain FBK_Gain. The operation of the accumulator circuit 14 is to add the step O_Step to the previous value of the gain FBK_Gain, and output this as the current gain value, used as the input gain I_Gain for the normalization circuit 15. A register 18 stores this current value of the calculated input gain, and outputs it as the feedback gain FBK_Gain. The sampling time of the register 18 is equal to the referesh rate of I_Data and O_Data.

The accumulator circuit 14 may optionally include a saturator 17 connected between the summer 16 and the register 18. The saturator 17 receives the output of the summer 16 and limits that output. For example, the saturator 17 may ensure that the output of the summer 16 (and therefore I_Gain and FBK_Gain) are within the interval of [0, MaxGain]. The output of the saturator 17, when the saturator 17 is present, is the input gain I_Gain for the normalization circuit 15, and is stored by the register 18 as the new current value of the calculated input gain I_Gain. The operation of the accumulator circuit 14 results in the input gain I_Gain ramping linearly upward or downward toward the current set gain value (in the case of a first order accumulator 14), with the rate of the ramp being set by the value of O_Step.

Understand that this is but one potential configuration for the accumulator 14, and that the accumulator 14 may instead result in the input gain I_Gain ramping upward or downward in a parabolic, exponential, or logarithmic fashion, for example by the accumulator 14 being a higher order accumulator.

Figure 3A:
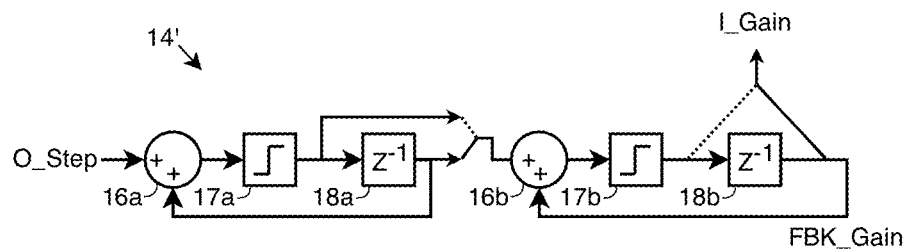
FIG. 3A is a block diagram of a first alternative accumulator such as may be used in FIGS. 2-3.

Shown in FIG. 3A is a particular second order configuration for the accumulator 14' that may be used, for example, to achieve parabolic ramps. The accumulator 14' includes a first summer 16a that adds the step signal O_Step from the gain step selection circuit 51 to the output of a first register 18a. A first saturator 17a is connected between the first summer 16a and the first register 18a, and serves to limit the output of the first summer 16a to be within the interval of [0, MaxGain]. The first register 18a stores the current value of the output of the first saturator 17a.

A second adder 16b receives as input the output of either the first register 18a or the first saturator 17a, and the feedback gain FBK_Gain, and provides the sum thereof to a second saturator 17b. The second saturator 17b limits the output of the summer 16b to be within the interval of [0, MaxGain]. A second register 18b stores the current value of the output of the second saturator 17b. The output of either the second saturator 17b or the second register 18b serves as the input gain I_Gain for the normalization circuit 15, and the output of the second register 18b serves as the feedback gain FBK_Gain.

Figure 3B:
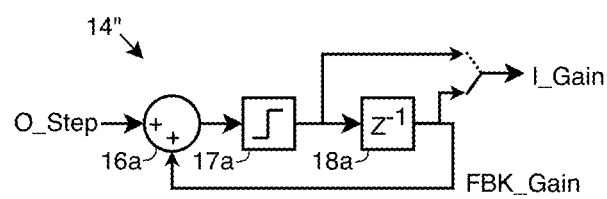
FIG. 3B is a block diagram of a second alternative accumulator such as may be used in FIGS. 2-3.

In addition, the accumulator 14" may be first order but with a different configuration than that of the accumulator 14. Such an example is shown in FIG. 3B, in which the new current value of the calculated input gain I_Gain may be output by either the saturator 17 or the register 18.

Figure 3C:
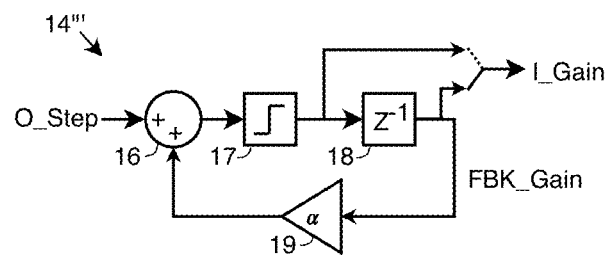
FIG. 3C is a block diagram of a third alternative accumulator such as may be used in FIGS. 2-3.

Another different configuration for the accumulator 14''' is shown in FIG. 3C. Here, the accumulator 14''' may operate as a filter. In the accumulator 14''', a multiplier 19 applies a multiplication factor $\alpha$ to the feedback gain FBK_Gain before its application to the summer 16. The multiplication factor $\alpha$ is within the interval of [0, 1] to obtain the low pass functionality. In addition, in this example, the new current value of the calculated input gain I_Gain may be output by either the saturator 17 or the register 18.

Returning to the description of FIG. 3, the gain step selection circuit 51 includes a plurality of comparator circuits 52(1), . . . , 52(n) each of which receives a gain value and a step value from a different source S1, . . . , Sn and provides output to a minimum selector circuit 57 that passes the minimum value it receives as the step signal O_Step. Each source S1, . . . , Sn has an associated requested gain value I_gain_1, . . . , I_gain_n and requested step value I_step_1, . . . , I_step_n, and may be either a functional source or a protection source. Each value of I_gain_1, . . . , I_gain_n may range freely in the interval [0, MaxGain], and each value of I_step_1, . . . , I_step_n may range freely in the interval [0, MaxGain]. There may be any number of such sources S1, . . . , Sn, and there are an equal number of comparator circuits 52(1), . . . , 52(n) as there are sources S1, . . . , Sn.

As explained, the gain value I_gain_1, . . . , I_gain_n output by each source S1, . . . , Sn is the desired value for the gain I_Gain to be applied to the normalizing circuit 15, and is a non-negative value. The step value I_step_1, . . . , I_step_n output by each source S1, . . . , Sn is the desired variation of the gain I_Gain, and is a non-negative value. The larger the step value, the faster the ramping of the input gain I_Gain is, and the smaller the step value, the slower the ramping of the input gain I_Gain is.

Each comparator circuit 52(1), . . . , 52(n) includes a three-value comparator 53(1), . . . , 53(n) and a multiplier 54(1), . . . , 54(n). a three-value comparator compares the difference between the received gain value and feedback gain value. If the received gain value is greater than the feedback gain value, the output of the three-value comparator is one. If the received gain value is equal to the feedback gain value, the output of the three-value comparator is zero. If the received gain value is less than the feedback gain value, the output of the three-value comparator is negative one. Each three-value comparator 53(1), . . . , 53(n) operates in this fashion.

In one specific example, the three-value comparators may be, for example, a cascade of a differentiator and a sign function. In another example, a direct comparison between the two values input to the three-value comparator is performed.

Each three-value comparator 53(1), . . . , 53(n) has a positive input terminal receiving a respective gain value I_gain_1, . . . , I_gain_n, a negative input terminal receiving the feedback gain value FBK_Gain, and an output terminal providing output to one of the multipliers 54(1), . . . , 54(n). Each three-value comparator 53(1), . . . , 53(n) compares the value of I_gain_1, . . . , I_gain_n and FBK_Gain at its input, outputs a one if I_gain_1, . . . , I_gain_n is greater than FBK_Gain, outputs a zero if I_gain_1, . . . , I_gain_n is equal to FBK_Gain, and outputs a negative one if I_gain_1, . . . , I_gain_n is less than FBK_Gain. This can be referred to as "step polarization".

The multipliers 54(1), . . . , 54(n) receive output from the three-value comparators 53(1), . . . , 53(n) as well as respective step values as input, perform step polarization, and provide output to the minimum selector circuit 57. Due to the outputs of each three-value comparator 53(1), . . . , 53(n) being either a one, a zero, or a negative one, this means that where the output of a given three-value comparator 53(1), . . . , 53(n) is a one, the value of the associated step I_step_1, . . . , I_step_n is unchanged by the multiplier 54(1), . . . , 54(n), where the output of a given three-value comparator 53(1), . . . , 53(n) is a zero, the value of the associated step I_step_1, . . . , I_step_n is suppressed, and where the output of a given three-value comparator 53(1), . . . , 53(n) is a negative one, the value of the associated step I_step_1, . . . , I_step_n is inverted.

In particular, the three-value comparator 53(1) receives the gain value I_gain_1 at its positive input terminal, receives the feedback gain value FBK_Gain at its negative input terminal, and provides its output to the multiplier 54(1). The multiplier 54(1) multiplies the output of the three-value comparator 53(1) by the step value I_step_1 and provides the output of that operation to the minimum selector circuit 57.

The three-value comparator 53(n) receives the gain value I_gain_n at its positive input terminal, receives the feedback gain value FBK_Gain at its negative input terminal, and provides its output to the multiplier 54(n). The multiplier 54(n) multiplies the output of the three-value comparator 53(n) by the step value I_step_n and provides the output of that operation to the minimum selector circuit 57.

Overall operation of the audio playback circuit 50 for muting and volume control is as follows.

Muting is first discussed. In the below, assume that one of the sources S1, . . . , Sn is requesting a gain and step of less than MaxGain, while the other sources are requesting a gain of MaxGain.

Therefore, assume initially that the input gain I_Gain for the normalization circuit 15 (and therefore the feedback gain FBK_Gain) is set to a desired initial level of MaxGain—for example, to achieve a desired volume level during audio playback. Assume now that one of the sources S1, . . . , Sn requests a decrease in volume to a muted level (while the other sources do not request a gain change), with the muted level being indicated by the gain value I_gain_1, . . . , I_gain_n sent by that source S1, . . . , Sn and the desired ramp being indicated by the step value I_step_1, . . . , I_step_n sent by that source.

For sake of example, assume that the source S1 has requested a decrease in volume level to a muted level, with the muted level being indicated by I_gain_1 and the ramp (time to ramp down from a gain of I_Gain to I_gain_1) being indicated by I_step_1. As a result, I_gain_1 is less than the feedback gain FBK_Gain, and therefore the minimum selector circuit 57 will pass I_step_1 (with its sign being set by the output of the three-value comparator 53(1)) as the step signal O_step.

The step signal O_step will be negative in this instance (since the gain value I_gain_1 is less than the feedback gain FBK_Gain). Therefore, the summer 16 in the accumulator 14 will subtract the step signal O_step from the feedback gain FBK_Gain to produce an updated value for the input gain I_Gain, and this value will be stored by the register 18 as an updated value for the feedback gain FBK_Gain. As a result, the operation of the muting circuit during the current clock cycle will be to lower the volume of O_Data as compared to I_Data by an amount indicated by O_Step.

Assume now that at the next clock cycle, I_gain_1 is still less than FBK_Gain. The operation will then repeat, with O_Step being produced the same way as described, and I_Gain (and therefore FBK_Gain) being decremented by O_Step. At each clock cycle, the operation will repeat until FBK_Gain is finally equal to I_gain_1 and the decrease in volume level from the initial level to the muted level has been achieved. Since the decrementation of I_Gain will be by O_Step, and since O_Step is ultimately set by I_step_1, the "slope" (speed) of the decrease in the volume from the initial level to the muted level is set by I_step_1.

This operation is the same for each of the comparator circuits 52(1), . . . , 52(n) with O_Step being set by whichever of the comparator circuits outputs the lowest value.

Un-muting is now discussed. In the below, assume that one of the sources S1, . . . , Sn is requesting a gain and step of less than MaxGain, while the other sources are requesting a gain of MaxGain.

Assume again that the input gain I_Gain for the normalization circuit 15 (and therefore the feedback gain FBK_Gain) is set to a desired initial level—here, a muted level. Assume now that one of the sources S1, . . . , S2 requests an increase in volume to an updated level than is less than MaxGain, with the updated volume level being indicated by the gain value sent by that source and the desired ramp being indicated by the step value sent by that source.

For sake of example, assume that the source S1 has requested an increase in volume level to an updated level, with the updated volume level being indicated by a target gain I_gain_1 and the desired ramp (time to ramp up from a gain of I_Gain to I_gain_1) being indicated by I_step_1. As a result, I_gain_1 is greater than the feedback gain FBK_Gain, and therefore the minimum selector circuit 57 will pass I_step_1 (with its sign being set by the output of the three-value comparator 53(1)) as the step signal O_step, assuming that the output of the multiplier 54(1) is lower than that of the other multipliers.

The step signal O_step will be positive in this instance (since the gain value I_gain_1 is greater than the feedback gain FBK_Gain). Therefore, the summer 16 in the accumulator 14 will add the step signal O_Step to the feedback gain FBK_Gain to produce an updated value for the input gain I_Gain, and this value will be stored by the register 18 as an updated value for the feedback gain FBK_Gain. As a result, the operation of the muting circuit during the current clock cycle will be to increase the volume of O_Data as compared to I_Data by an amount indicated by O_Step.

Assume now that at the next clock cycle, I_gain_1 is still greater than FBK_Gain. The operation will then repeat, with O_Step being produced the same way as described, and I_Gain (and therefore FBK_Gain) being incremented by O_Step. At each clock cycle, the operation will repeat until FBK_Gain is finally equal to I_gain_1 and the increase in volume level from the initial level to the muted level has been achieved. Since the incrementation of I_Gain will be by O_Step, and since O_Step is ultimately set by I_step_1, the "slope" (speed) of the increase in the volume from the initial level to the updated level is set by I_step_1.

From the above, it can be understood that through the use of the gain step selection circuit 51, the muting and volume control functionality is centralized, and this centralization can work with any number of sources sending gain and step signals. Since muting and volume control provided is performed fully in the digital portion 41, the ramp times achievable can be quite high, such as 700 ms or higher.

As explained above, the saturator 17 is optional, and may be used to ensure that the output of the summing circuit 16 (and therefore I_Gain and FBK_Gain) are within the interval of [0, MaxGain]. Therefore, in applications where the saturator 17 is not present, it is possible for the output of the summing circuit 16 to be outside of the interval of [0, MaxGain]. This can lead to malfunction. Therefore, where MaxGain is not an integer multiple of each value of I_step_1, . . . , I_step_n, the saturator 17 is to be used.

The gain I_Gain applied to the normalization circuit 15 may oscillate where there is not an integer relation among the starting value of FBK_Gain and each value of I_gain_1, . . . , I_gain_n, and among the starting value of FBK_Gain and each value of I_step_1, . . . , I_step_n.

Figure 4:
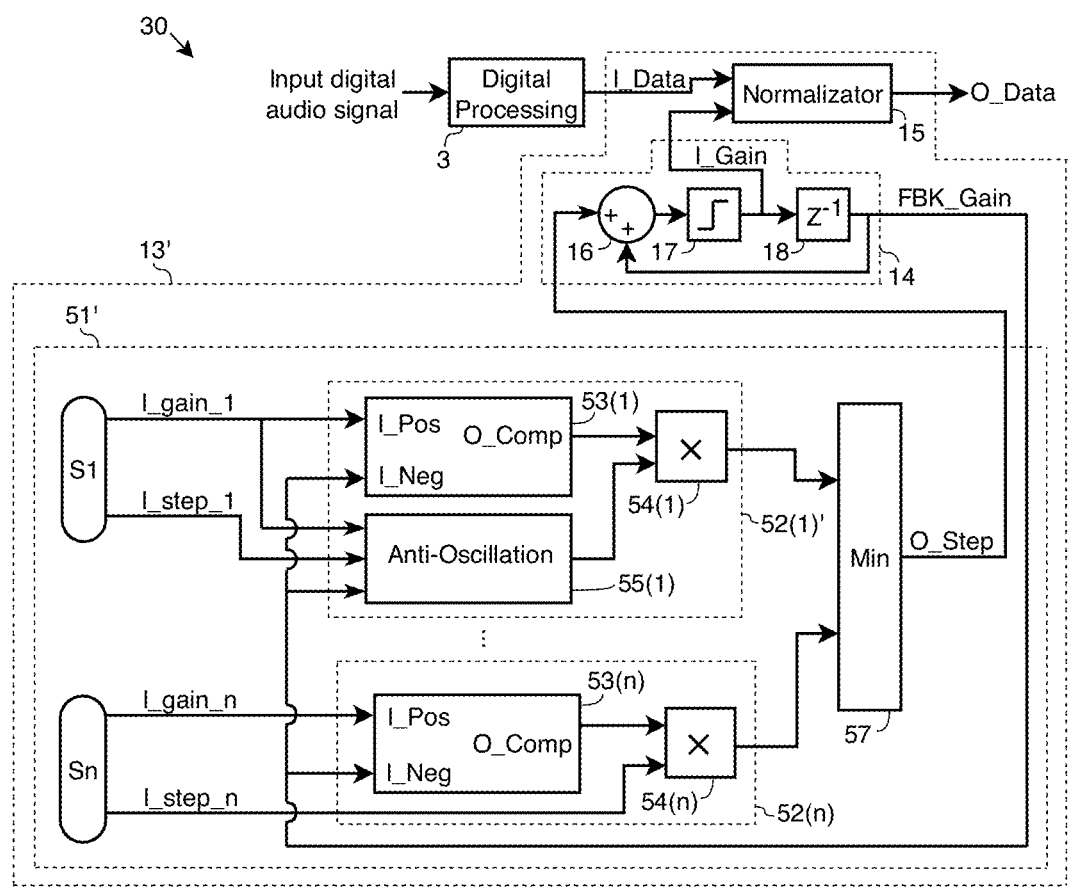
FIG. 4 is a block diagram of the digital signal chain of FIG. 3 in which an alternative gain step selection circuit is shown.

Therefore, to avoid oscillation, an anti-oscillation circuit 55(1) is included in the comparator circuit 52(1)' of the gain step selection circuit 51', as shown in FIG. 4, although a replica of the anti-oscillation circuit may also be included within additional comparator circuits. The anti-oscillation circuit 55(1) receives as input the gain value (e.g., I_gain_1) and the step value (e.g., I_step_1) received by the three-value comparator 53(1), as well as the feedback gain FBK_Gain.

Figure 5:
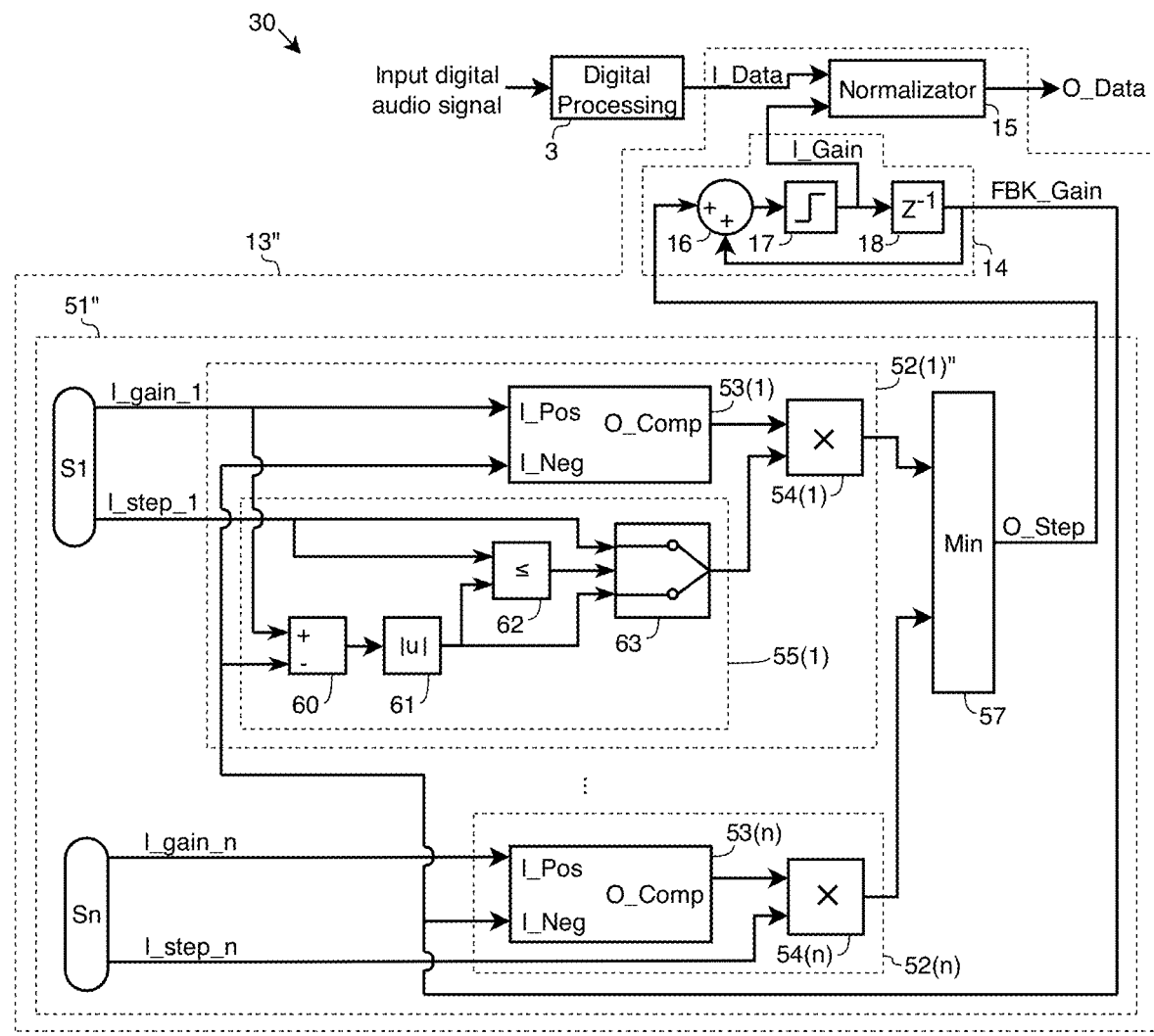
FIG. 5 is a more detailed embodiment of FIG. 4 in which a different alternative gain step selection circuit is shown.

Potential implementation details of the anti-oscillation circuit 55(1) are now described with additional reference to FIG. 5. As shown in FIG. 5, the anti-oscillation circuit 55(1) includes a subtracting circuit 60 that calculates the difference between the target gain I_gain_1 and the feedback gain FBK_Gain, and an absolute value circuit 61 that produces the absolute value of the difference between the target gain and feedback gain calculated by the subtracting circuit 60. A comparison circuit 62 compares the absolute value of the difference between the target gain and feedback gain to the desired step value I_step_1. If the desired step is less than or equal to the absolute value of difference between the target gain and feedback gain, then a multiplexing circuit 63 passes the desired step value I_step_1 to the multiplier 54(1), otherwise the multiplexing circuit 63 passes absolute value of the difference between the target gain and feedback gain to the multiplier 54(1).

The use of the anti-oscillation circuit 55(1) avoids oscillation in the gain I_Gain applied to the normalization circuit 15 that may occur if there is not an integer relation between the starting value of FBK_Gain and each value of the gains I_gain_1, . . . , I_gain(n), and if there is not an integer relation between the starting value of FBK_Gain and each value of step values I_step_1, . . . , I_step_n.

In this illustrated example, the anti-oscillation circuit 55(1) is included within the comparator circuit 52(1)", but it should be understood that there may instead be a respective such anti-oscillation circuit included within any or all of the comparator circuits.

In the example embodiments shown, the explained operation of the accumulator 14 results in the gain ramp being implemented as a linear ramp. However, the operation of the accumulator 14 may instead be such that the gain ramp is implemented as another ramp shape, such as a parabolic, exponential, or logarithemic ramp.

Figure 6A:
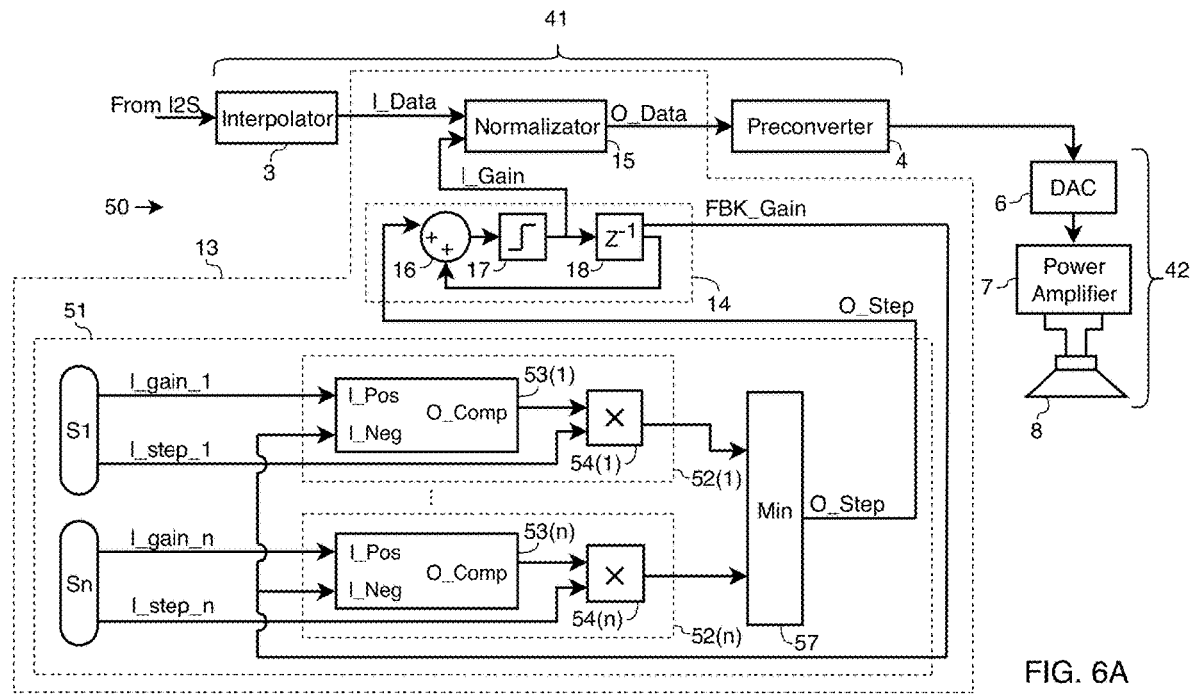
FIG. 6A is a block diagram of a first audio playback circuit including a muting circuit described herein.

The muting circuit 13 may be used in a digital audio playback circuit 50, as shown in FIG. 6A. The digital audio playback circuit 50 includes a digital portion 41 and an analog portion 42.

The digital portion 41 includes an interpolator 3, which receives a 24-bit input digital audio signal, such as a pulse coded modulated signal, over an I2S bus. The interpolator 3 increases the effective sampling frequency of the input digital audio signal and produces an input data signal I_Data to the muting circuit 13. The muting circuit 13 may be any of the muting circuits described above, and applies a rising or falling gain ramp to the input data signal I_Data to produce an output data signal O_Data, which is provided to a preconverter 4. The preconverter 4 performs noise shaping and scaling to produce a noise shaped output signal that has a reduced bit depth, for example 7 bits. The noise shaped output signal is provided to a digital to analog converter (DAC) 6 in the analog portion 42. The DAC 6 converts the noise shaped output signal to an analog audio signal, which is amplified by a power amplifier 7 that powers an audio transducer 8 such as a speaker.

Figure 6B:
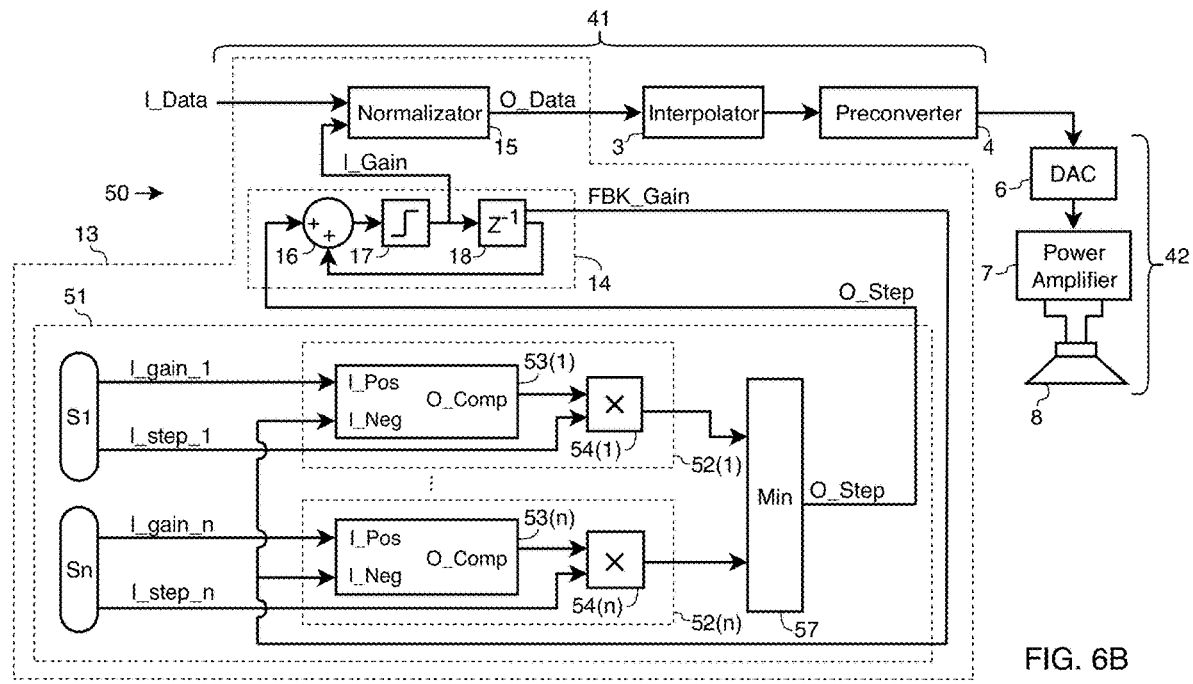
FIG. 6B is a block diagram of a second audio playback circuit including a muting circuit described herein.

As an alternative to the configuration shown in FIG. 6A, the muting circuit 13 may provide the output data signal O_Data to the interpolator 3, which may in turn increase the effective sampling frequency of the output data signal D Data before it is passed to the preconverter 4, as shown in FIG. 6B.

Figure 7:
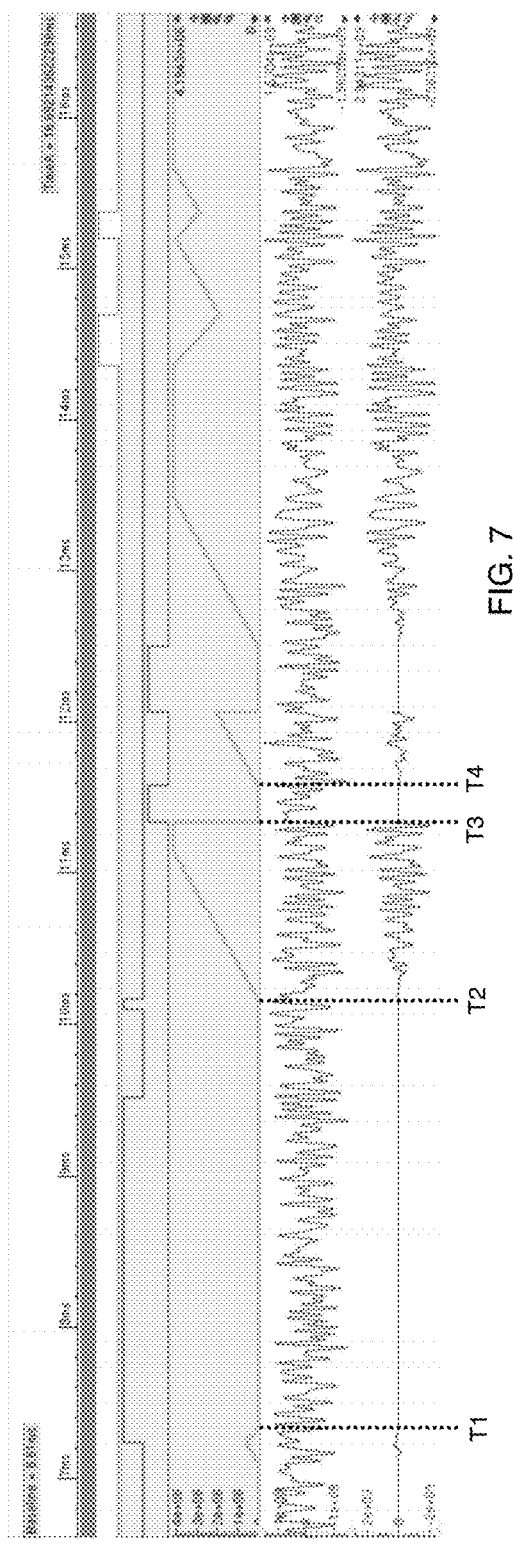
FIG. 7 is a graph showing values of the audio playback circuit of FIG. 6 in operation when performing muting.

The use of the muting circuit 13 provides the digital audio playback circuit 50 with centralized digital muting and volume control functionality. Shown in FIG. 7 is a graph of the current input gain I_Gain, input data signal I_Data, and output data signal O_Data during operation when muting is performed. In the graph shown, the input and output data signals I_Data and O_Data are shown at a high sampling rate for ease of understanding of the effect on the sound output by the audio transducer 8 during playback.

Notice that at time T1, the gain I_Gain goes to zero, and therefore despite the input data signal I_Data being non-zero between times T1 and T2, the output data signal O_Data is zero—muting is therefore achieved, and between times T1 and T2, the audio would be muted and not played. Between times T2 and T3, the gain I_Gain ramps upwardly, performing a fade-in. The effect of this fade-in can be observed on the output data signal O_Data, with the amplitude increasing between times T2 and T3. Between times T3 and T4, the gain I_Gain falls back to zero, which can be observed in the output data signal O_Data again being muted.

Figure 8:
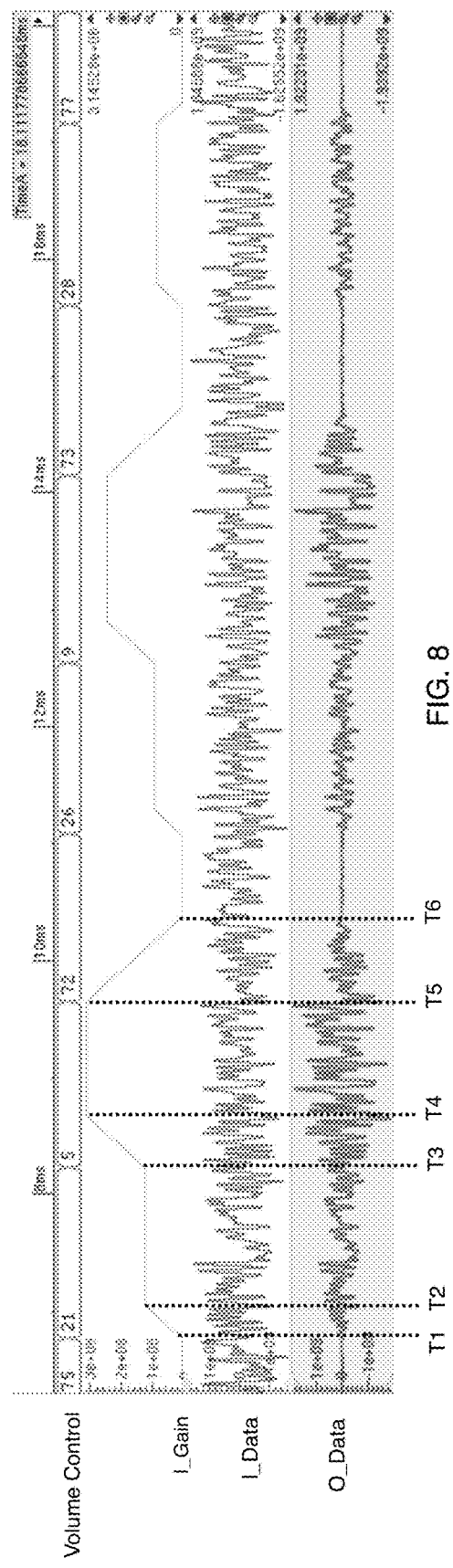
FIG. 8 is a graph showing values of the audio playback circuit of FIG. 6 in operation when performing volume control.

Shown in FIG. 8 is a graph of the current input gain I_Gain, input data signal I_Data, and output data signal O_Data during operation when volume control is performed. In the graph shown, the input and output data signals I_Data and O_Data are shown at a high sampling rate for ease of understanding of the effect on the sound output by the audio transducer 8 during playback.

At time T1, the gain I_Gain ramps upwardly from zero, and therefore the amplitude of the output data signal O_Data increases from zero to a non-zero value between times T1 and T2. Between times T2 and T3, the gain I_Gain remains flat, and therefore the output data signal O_Data follows the input data signal I_Data. Between times T3 and T4, the gain I_Gain again ramps upwardly, and therefore the magnitude of the output data signal O_Data increases until between times T4 and T5 the gain I_Gain is flat. At time T5, the gain then ramps downwardly, and therefore between times T5 and T6 the amplitude of the output data signal O_Data decreases until at time T6 it becomes zero (because at time T6, the gain has fallen to zero).

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A device, comprising:
   a gain step selection circuit configured to:
   receive a different requested gain value and an associated requested step size from each of a plurality of sources;
   compare each requested gain value to a same feedback gain value and generate a polarity based thereupon;
   perform step polarization on each requested step size based upon the polarity generated from its associated requested gain value to thereby generate a plurality of step values; and
   output a least one of the plurality of step values as an output step value;
   an accumulator circuit configured to generate a current input gain value based upon the output step value and the feedback gain value, and then update the feedback gain value to be equal to the current input gain value; and
   a normalizing circuit configured to multiply an input data value by the current input gain value and apply a truncation function to a result thereof to produce an output data value.

2. The device of claim 1, wherein the gain step selection circuit performs the step polarization on each requested step size by:
   maintaining the requested step size at its current value if the requested step size is greater than the feedback gain value;
   setting the requested step size to zero if the requested step size is equal to the feedback gain value; and
   inverting a sign of the requested step size if the requested step size is less than the feedback gain value.

3. The device of claim 1, wherein the accumulator circuit is configured to generate the current input gain value by adding the output step value to the feedback gain value, and to update the feedback gain value by adding the current input gain value to the feedback gain value.

4. The device of claim 3, wherein the accumulator circuit is further configured to apply a saturation function to a sum of the output step value and the feedback gain value to thereby generate the current input gain value.

5. The device of claim 1, wherein the accumulator circuit comprises:
   a summing circuit receiving as input the output step value and adding the output step value to the feedback gain value to produce the current input gain value; and
   a register receiving as input the current input gain value to thereby update the feedback gain value.

6. The device of claim 5, wherein the accumulator circuit further comprises a multiplier applying a multiplication factor to the feedback gain value prior to the feedback gain value being received by the summing circuit, the multiplication factor being a non-zero floating point number less than one or a fixed point number.

7. The device of claim 1, wherein the accumulator circuit comprises:
   a summing circuit receiving as input the output step value and adding the output step value to the feedback gain value; and
   a register receiving output of the summing circuit to thereby update the feedback gain value and output the current input gain value.

8. The device of claim 7, wherein the accumulator circuit further comprises a multiplier applying a multiplication factor to the feedback gain value prior to the feedback gain value being received by the summing circuit, the multiplication factor being a non-zero floating point number less than one.

9. The device of claim 1, wherein the accumulator circuit comprises:
   a first summing circuit receiving as input the output step value and adding a first register output to the output step value to produce a first intermediate output;

a first register receiving as input the first intermediate output to thereby update a stored gain value;
a second summing circuit receiving as input either the first intermediate output or the stored gain value, and adding the feedback gain value thereto in order produce a second intermediate output; and
a second register receiving as input the second intermediate output to thereby update the feedback gain value;
wherein the current input gain value is equal to either the second intermediate output or the feedback gain value.

10. The device of claim 1, wherein the gain step selection circuit comprises:
a first three-value comparator receiving a first of the different requested gain values and the feedback gain value as input, the first three-value comparator configured to compare the received requested gain value to the feedback gain value and output a negative polarity if the requested gain value is less than the feedback gain value, output a positive polarity if the requested gain value is greater than the feedback gain value, and output a null polarity if the requested gain is equal to the feedback gain value;
a first step polarization circuit configured to perform step polarization on the first of the different requested gain values to produce one of the plurality of step values, based upon the polarity output by the first three-value comparator;
a second three-value comparator receiving a second of the different requested gain values and the feedback gain value as input, the second three-value comparator configured to compare the received requested gain value to the feedback gain value and output a negative polarity if the requested gain value is less than the feedback gain value, output a positive polarity if the requested gain value is greater than the feedback gain value, and output a null polarity if the requested gain is equal to the feedback gain value;
a second step polarization circuit configured to perform step polarization on the second of the different requested gain values to produce another of the plurality of step values, based upon the polarity output by the second three-value comparator; and
a minimum selector circuit configured to receive each of the plurality of step values as input and output a least of the plurality of step values as the output step value.

11. The device of claim 1, wherein the gain step selection circuit comprises:
a first three-value comparator receiving a first of the different requested gain values and the feedback gain value as input, the first three-value comparator configured to compare the received requested gain value to the feedback gain value and output a negative polarity if the requested gain value is less than the feedback gain value, output a positive polarity if the requested gain value is greater than the feedback gain value, and output a null polarity if the requested gain is equal to the feedback gain value;
a first step polarization circuit configured to perform step polarization on the received value to produce one of the plurality of step values, based upon the polarity output by the first three-value comparator;
an anti-oscillation circuit configured to:
calculate an absolute value of a difference between the first of the different requested gain values and the feedback gain value; and
pass the requested step size associated with the first of the different requested gain values to the first step polarization circuit for use as the received value if the requested step size is less than or equal to the absolute value, and otherwise pass the absolute value to the first step polarization circuit for use as the received value.

12. The device of claim 11, further comprising:
a second three-value comparator receiving a second of the different requested gain values and the feedback gain value as input, the second three-value comparator configured to compare the received requested gain value to the feedback gain value and output a negative polarity if the requested gain value is less than the feedback gain value, output a positive polarity if the requested gain value is greater than the feedback gain value, and output a null polarity if the requested gain is equal to the feedback gain value;
a second step polarization circuit configured to perform step polarization on the requested step size to to produce another of the plurality of step values, based upon the polarity output by the second three-value comparator; and
a minimum selector circuit configured to receive each of the plurality of step values as input and output a least of the plurality of step values as the output step value.

13. The device of claim 11, wherein the anti-oscillation circuit comprises:
a subtraction circuit configured to determine a difference between the first of the different requested gain values and the feedback gain value;
an absolute value circuit configured to determine an absolute value of the difference determined by the subtraction circuit;
a comparison circuit configured to compare the requested step size associated with the first of the different requested gain values to the absolute value;
a multiplexing circuit configured to receive output from the first comparison circuit and to pass the requested step size associated with the first of the different requested gain values to the first step polarization circuit for use as the received value if the requested step size is less than or equal to the absolute value, and otherwise pass the absolute value to the first step polarization circuit for use as the received value.

14. The device of claim 1, further comprising:
an interpolator receiving an input digital audio signal and performing interpolation thereon to produce the input data value;
a preconverter receiving the output data value and performing digital processing thereon to produce an output digital audio signal;
a digital to analog converter configured to convert the output digital audio signal to an output analog audio signal; and
an audio transducer driven by the output analog audio signal.

15. The device of claim 1, further comprising:
an interpolator receiving the output data value and performing interpolation thereon;
a preconverter receiving the output data value after interpolation and performing digital processing thereon to produce an output digital audio signal;
a digital to analog converter configured to convert the output digital audio signal to an output analog audio signal; and
an audio transducer driven by the output analog audio signal.

16. The device of claim 1, further comprising:
a digital to analog converter configured to convert the output data value to an output analog audio signal; and
an audio transducer configured to be driven by the output analog audio signal to produce audible sound;
wherein the audible sound has a volume that is controlled based on the current input gain value generated by the accumulator circuit.

17. The device of claim 1, further comprising:
a preconverter configured to receive the output data value and perform digital processing thereon to produce an output digital audio signal;
a digital to analog converter configured to convert the output digital audio signal to an output analog audio signal;
a power amplifier configured to amplify the output analog audio signal; and
an audio transducer configured to be driven by the amplified output analog audio signal to produce audible sound;
wherein the audible sound has characteristics that are controlled based on the operations performed by the normalizing circuit, including volume control and muting based on the current input gain value generated by the accumulator circuit.

18. A method of digital audio signal processing, comprising:
receiving a different requested gain value and an associated requested step size from each of a plurality of sources;
comparing each requested gain value to a same feedback gain value and generating a polarity based thereupon;
performing step polarization on each requested step size based upon the polarity generated from its associated requested gain value to thereby generate a plurality of step values;
outputting a least of the plurality of step values as an output step value;
generating a current input gain value based upon the output step value and the feedback gain value, and updating the feedback gain value to be equal to the current input gain value; and
multiplying an input data value by the current input gain value and applying a truncation function to a result thereof to produce an output data value;
converting the output data value to an analog audio signal;
amplifying the analog audio signal; and
driving an audio transducer with the amplified analog audio signal to produce audible sound, wherein characteristics of the audible sound, including volume and muting, are controlled based on the current input gain value.

19. The method of claim 18, wherein the step polarization is performed on each requested step size by:
maintaining the requested step size at its current value if the requested step size is greater than the feedback gain value;
setting the requested step size to zero if the requested step size is equal to the feedback gain value; and
inverting a sign of the requested step size if the requested step size is less than the feedback gain value.

20. The method of claim 18, wherein the current input gain value is generated by adding the output step value to the feedback gain value, and wherein the feedback gain value is updated by adding the current input gain value to the feedback gain value.

21. The method of claim 20, further comprising applying a saturation function to the sum of the output step value and the feedback gain value to thereby generate the current input gain value.

22. The method of claim 18, further comprising:
calculating an absolute value of a difference between one of the requested gain values and the feedback gain value; and
wherein the step polarization for one of the requested step sizes associated with the one of the requested gain values is performed on the absolute value if that requested step size is less than or equal to the absolute value.

* * * * *